United States Patent [19]
Fitch et al.

[11] Patent Number: 5,213,989
[45] Date of Patent: May 25, 1993

[54] METHOD FOR FORMING A GROWN BIPOLAR ELECTRODE CONTACT USING A SIDEWALL SEED

[75] Inventors: Jon T. Fitch; Carlos A. Mazuré; James D. Hayden, all of Austin, Tex.

[73] Assignee: Motorola, Inc., Schaumburg, Ill.

[21] Appl. No.: 903,300

[22] Filed: Jun. 24, 1992

[51] Int. Cl.⁵ .......................................... H01L 21/265
[52] U.S. Cl. ........................................ 437/31; 437/89; 437/162; 437/203; 148/DIG. 11
[58] Field of Search ............... 437/31, 89, 90, 162, 437/203, 31; 148/DIG. 11

[56] References Cited

U.S. PATENT DOCUMENTS

| | | | |
|---|---|---|---|
| 4,473,598 | 9/1984 | Ephrath et al. | 437/90 |
| 4,824,794 | 4/1989 | Tabata et al. | 437/89 |
| 4,847,214 | 7/1989 | Robb et al. | 437/90 |
| 4,975,381 | 12/1990 | Taka et al. | 437/31 |
| 4,996,581 | 2/1991 | Hamasaki | 437/31 |
| 5,059,544 | 10/1991 | Burghartz et al. | 437/31 |
| 5,061,644 | 10/1991 | Yue et al. | 437/31 |
| 5,091,321 | 2/1992 | Huie et al. | 437/27 |
| 5,098,638 | 3/1992 | Sawada | 437/31 |

FOREIGN PATENT DOCUMENTS

| | | | |
|---|---|---|---|
| 0134819 | 8/1984 | Japan | 437/90 |
| 0175744 | 10/1984 | Japan | 437/89 |
| 0222923 | 12/1984 | Japan | 437/89 |
| 0193324 | 10/1985 | Japan | 437/89 |
| 0019118 | 1/1986 | Japan | 437/89 |

OTHER PUBLICATIONS

T. Sakai, "Recent Advances in High Speed Bipolar LSI Technology", Extended Abstracts of the 17th Conf. on Solid State Devices and Materials, Tokyo, pp. 373-376, 1985.

T. Sakai et al., "High Speed Bipolar ICs Using Super Self-Aligned Process Technology", Jap. J. Appl. Phys. Supplement 20-1, vol. 20, 1981.

*Primary Examiner*—Brian E. Hearn
*Assistant Examiner*—Tuan Nguyen
*Attorney, Agent, or Firm*—Robert L. King

[57] ABSTRACT

A method for forming a grown bipolar transistor electrode contact wherein a substrate (12) is provided. A doped region (31) is formed within the substrate (12). A dielectric layer (26) is formed having an opening (36) which exposes a portion of the doped region (31). Conductive spacers (38) are formed adjacent a sidewall of the dielectric layer (26). A conductive region (34) is formed through either a selective process or an epitaxial process by using the conductive spacers (38) as a source for epitaxial or selective formation. The conductive region (34) forms the grown bipolar electrode contact by electrically contacting the doped region (31). The conductive region (34) is optionally overgrown in a lateral direction over a top surface of the dielectric layer (26) to form a self-aligned electrical contact pad for the doped region (31).

20 Claims, 7 Drawing Sheets

METHOD FOR FORMING A GROWN BIPOLAR ELECTRODE CONTACT USING A SIDEWALL SEED

FIELD OF THE INVENTION

The present invention relates generally to semiconductor technology, and more particularly, to methods of forming bipolar electrode contacts.

BACKGROUND OF THE INVENTION

A known and accepted circuit element in the integrated circuit industry is the bipolar junction transistor (BJT). A popular and widely accepted BJT is known as the diffused BJT. In a diffused BJT, a diffusion region is formed that functions as a collector for the BJT. A base diffusion is formed within the collector diffusion, and an emitter electrode diffusion is formed within the base diffusion.

Another BJT that is known and accepted in the integrated circuit industry is the single polysilicon BJT. In the single polysilicon BJT, a deposited polysilicon layer is used to form an emitter electrode and/or an emitter contact. A diffusion is used to form a base electrode adjacent the emitter electrode, and a deep collector is formed by a buried doped region which underlies the base and emitter electrodes.

Yet another BJT which is known and accepted in the integrated circuit industry is the double polysilicon BJT. In the double polysilicon BJT, a first deposited polysilicon layer is used to form an emitter electrode and/or an emitter contact. A second deposited polysilicon layer is used to form a base electrode portion adjacent the emitter electrode. A deep collector is formed by a buried doped region which underlies the base and emitter electrodes in a manner which is similar to the single polysilicon BJT.

In the above embodiments, electrical contacts are formed to each of the emitter, base, and collector by forming one or more conductive layers over each of either the emitter, base, and collector by either deposition or a sputtering process. The contacts are therefore not self-aligned in some cases and result in structures that are less than optimal in terms of surface area. Photolithographic alignment and alignment tolerances also contribute to increased surface area when using this technology.

In order to self-align various features of a BJT, epitaxially grown emitter electrode contacts have been used. These epitaxially grown emitter electrode contacts are grown only from the substrate. In some cases, the emitter electrode contacts are grown in a manner that allows for the contact material to laterally overgrow a top portion of an oxide layer wherein the oxide layer is positioned adjacent the emitter electrode contacts. The lateral overgrowth of the emitter electrode contact is used to form a self-aligned contact pad for the emitter electrode. By initiating the growth from the substrate surface only, a long growth time is required for overgrowth to occur. Therefore, the epitaxial step, which is usually performed at temperatures of 850° C. or higher, contributes greatly to a thermal budget of the overall integrated circuit process. A large thermal budget results in deeper diffused electrode regions that will, in most cases, increase parasitic capacitance and resistance and degrade bipolar transistor performance.

SUMMARY OF THE INVENTION

The previously mentioned disadvantages are overcome and other advantages achieved with the present invention. In one form, the present invention comprises a method for forming an electrical contact to a bipolar transistor electrode wherein a substrate is provided. A layer of material having a top surface is formed overlying the substrate. An opening is formed in the layer of material wherein the opening exposes a portion of the substrate and has a sidewall. A conductive region is formed within the substrate. The conductive region functions as the bipolar transistor electrode. A sidewall selective source material is formed adjacent the sidewall of the opening. A conductive contact region is formed within the opening via growth. The growth uses the sidewall selective source material as a growth source. The conductive contact region electrically contacts the bipolar electrode.

The present invention will be more clearly understood from the detailed description below in conjunction with the accompanying drawings.

DESCRIPTION OF A PREFERRED EMBODIMENT

Figure 1:
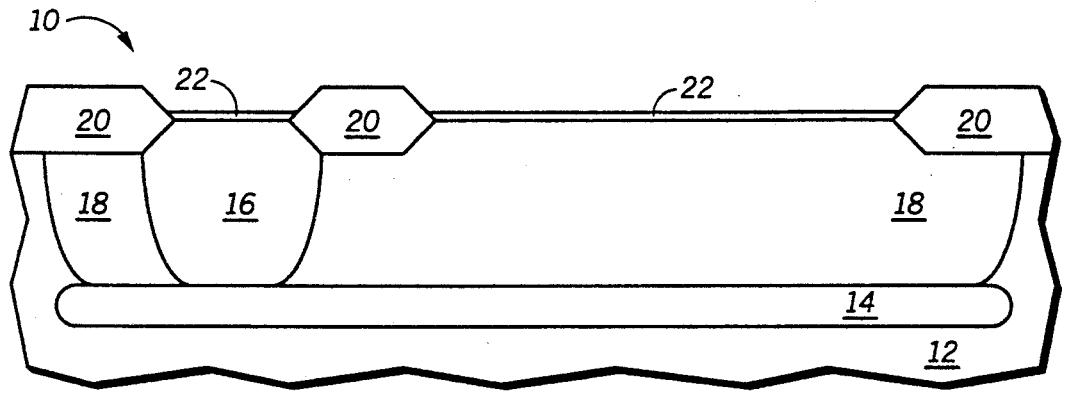
FIGS. 1-6 illustrate, in cross-sectional form, a method for forming a grown bipolar electrode contact in accordance with the present invention.

Illustrated in FIG. 1 is a structure suitable for formation of a bipolar transistor 10 which has an epitaxially grown bipolar electrode contact. Transistor 10 has a substrate 12. Substrate 12 has a top planar surface prior to transistor processing. The substrate 12 is formed having a conductivity type which is one of either a P type conductivity or an N type conductivity if the substrate 12 is silicon-based. Substrate 12 may be made of silicon, gallium arsenide, silicon on insulator (SOI) structures, epitaxial formations, germanium, germanium silicon, polysilicon, amorphous silicon, and/or like substrate or conductive materials. Preferably, the substrate 12 is made of single-crystalline silicon.

A collector buried region 14 is formed via an implantation step or formed by a doping step which is subsequently followed by epitaxial growth of substrate material. Many conventional methods exist for formation of a buried region, some of which include ion implantation, diffusion technology, trenching and/or epitaxial growth. A collector well region 18 is formed overlying the collector buried region 14. The collector well region 18 is formed within a portion of the substrate material. The portion of the substrate material is either a portion of the substrate 12 or a similar substrate material such as an epitaxial substrate region grown from substrate 12. A deep collector region 16 is formed to provide a low resistance/highly-doped electrical contact to the collector buried region 14. Together, regions 14, 16, and 18 form a collector electrode or a collector for the transistor 10. The collector is doped to a conductivity type which is opposite the conductivity type of the substrate 12.

A field dielectric layer 20 is selectively formed overlying portions of the substrate 12. Field dielectric layer 20 is usually a grown wet silicon dioxide ($SiO_2$) layer although other dielectric materials may be used. The dielectric layer 20 as well as other dielectric materials described herein may be formed as wet or dry silicon dioxide ($SiO_2$), silicon nitride, tetraethylorthosilicate (TEOS) based oxides, borophospho-silicate-glass (BPSG), phospho-silicate-glass (PSG), boro-silicate-glass (BSG), oxide-nitride-oxide (ONO), plasma enhanced silicon nitride ($P-SiN_x$), a spin on glass (SOG), and/or like dielectric materials unless otherwise noted. Other forms of isolation exist, such as trench isolation, local oxidation of silicon (LOCOS), or polysilicon buffered LOCOS (PBL), and any known form of isolation may be used to replace the field oxide isolation illustrated via dielectric layer 20. Regions of the surface of the substrate 12, deep collector region 16, and/or collector well region 18 which are not covered by dielectric layer 20 are referred to as active areas.

A thin dielectric layer 22 is formed over the deep collector region 16 and the collector well region 18 as illustrated in FIG. 1. The dielectric layer 22 is preferably grown to a single thickness within a range from 80 Angstroms to 500 Angstroms. Dielectric layer 22 is, in most cases, a grown wet or dry $SiO_2$ layer. A sacrificial oxide layer (not illustrated) may be formed and removed before formation of the dielectric layer 22 to improve device performance.

Figure 2:
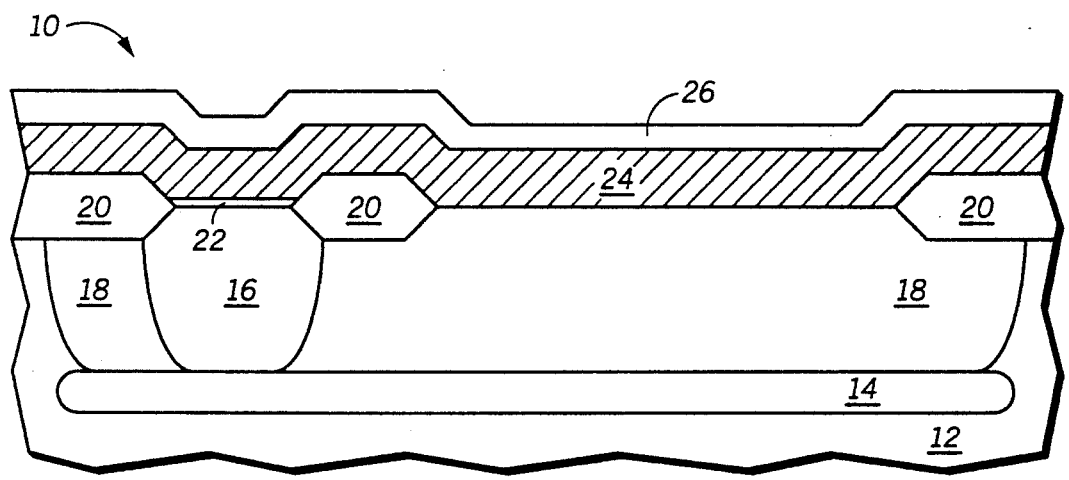

In FIG. 2, portions of the dielectric layer 22 which overlie the collector well region 18 are removed. A conductive layer 24 is formed overlying the dielectric layer 22, the collector well region 18 and the dielectric layer 20. The conductive layer 24 is in electrical contact with the collector well region 18. Preferably, the conductive layer 24 is polysilicon, amorphous silicon, or a like silicon-based material. The conductive layer 24 is ion implanted or doped with dopant atoms which are of the same conductivity type as the substrate 12 (one of either P type or N type). A dielectric layer 26 is formed over the conductive layer 24. Preferably, the dielectric layer 26 is a TEOS-based oxide and is formed via a CVD process.

Figure 3:
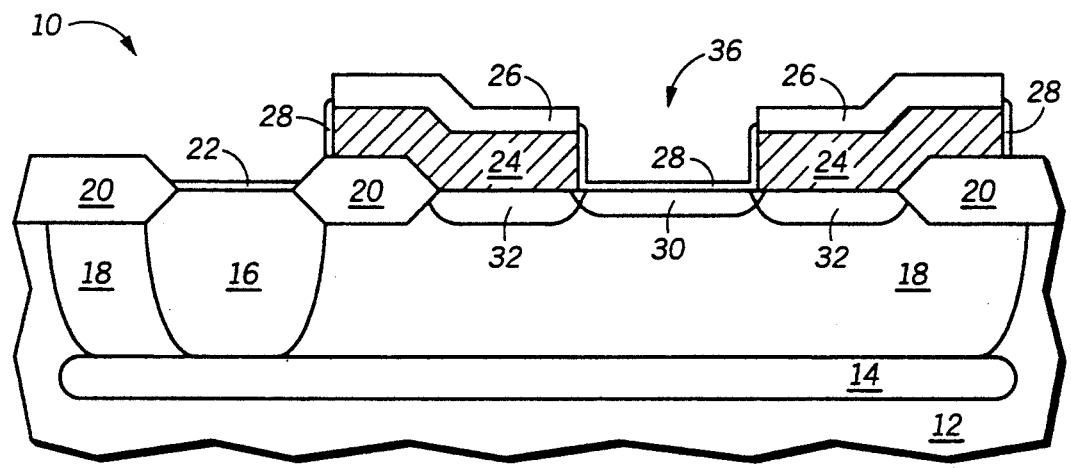

In FIG. 3, portions of the dielectric layer 26 and the conductive layer 24 are removed in an etch step to expose portions of the collector well region 18 and to expose portions of the dielectric layers 20 and 22. An opening 36 is formed through layers 24 and 26 via this etch step. In general, oxides may be etched using, for example, a $CHF_3$ and $O_2$ plasma or a $C_2F_6$ plasma. Polysilicon may be etched using a HBr and $Cl_2$ plasma.

Any of the above stated plasma environments may contain one or more inert carrier gases such as Ar, $H_2$, He, $N_2$, or a like inert carrier gas. The etching of layers 24 and 26 forms sidewalls of conductive layer 24.

In FIG. 3, the sidewalls of the conductive layer 24 and an exposed portion of the collector well region 18 are oxidized to selectively form oxide regions 28. Oxide regions 28 are preferably wet or dry silicon dioxide films. If the conductive layer 24 is made of a material which either does not oxidize or does not form a reliable quality oxide, a dielectric sidewall spacer (not illustrated) may be optionally used to electrically isolate portions of the conductive layer 24 from adjacent regions (not illustrated in FIG. 3).

In FIG. 3, either the thermal processing used to form the oxide regions 28 or an independent thermal processing step is used to drive dopant atoms from the conductive layer 24 into the collector well region 18 to form doped base regions 32. In addition, an ion implant step, a diffusion step, or a like doping step is used to form a self-aligned second doped base region 30 within the collector well region 18. The doped base regions 30 and 32 are of a conductivity type which is opposite the conductivity type of collector well region 18 and is the same as the conductivity type of the substrate 12. During the formation of the doped base region 30 a mask layer (not illustrated) may be needed to prevent dopant atoms from entering the deep collector region 16.

Figure 4:
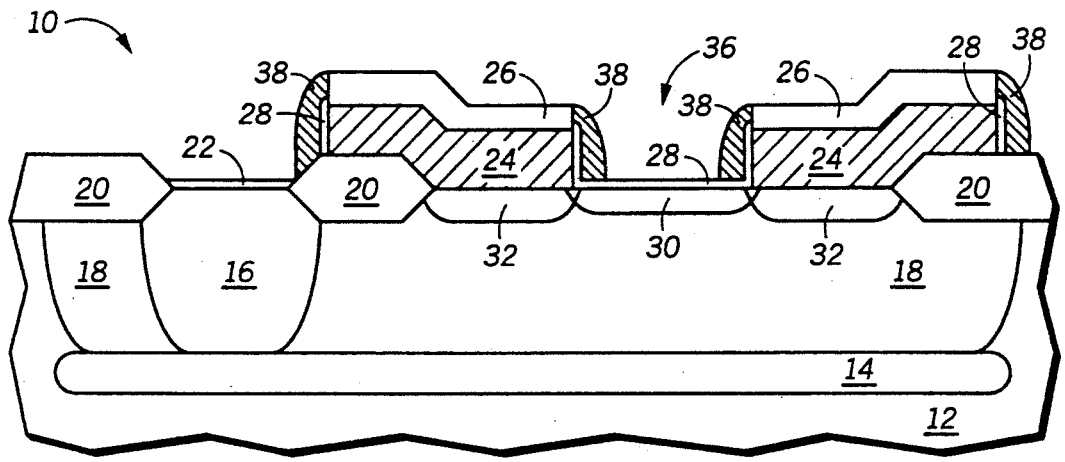

In FIG. 4, a conductive layer (not illustrated) is deposited overlying the dielectric layers 20, 22, and 26, and the oxide regions 28. The conductive layer is etched via a reactive ion etch (RIE) process or a similar etch process to form spacers 38. Preferably, the spacers 38 are formed of polysilicon or a like silicon-based material. The spacers 38 are formed with a bottom base spacer thickness ranging roughly from 400 Angstroms to 2,500 Angstroms.

Figure 5:
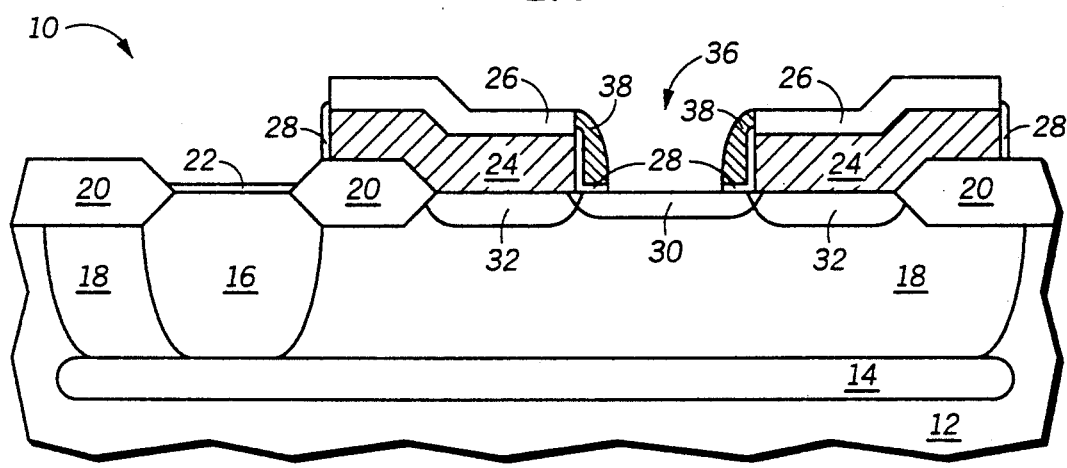

In FIG. 5, a conventional photoresist masking step is used to mask the spacers 38 which are adjacent the doped base regions 30 while the spacers 38 which are overlying the dielectric layer 20 are removed via an etch step. A wet etch step, such as etching in a solution containing nitric acid and HF, is used to remove the spacers 38 if the spacers 38 are polysilicon or silicon-based materials. In some cases, to avoid photoresist removal, a dry etch is used instead of a wet etch.

An optional masking layer (not illustrated) may be formed to protect exposed dielectric layers 20,22,26 and portions of oxide regions 28. A dielectric layer etch step is then used to etch the oxide regions 28 which overlie the collector well region 18. If no masking layer (not illustrated) is used, then the dielectric layers 20,22, and 26 must be formed thick enough to withstand a small time period of oxide etching without being completely removed. "L-shaped" dielectric regions of oxide regions 28, which are positioned laterally adjacent the sidewall of conductive layer 24, remain after the dielectric etch step as illustrated. The dielectric etch step may, as indicated above, slightly remove exposed portions of other oxides and may undercut the spacers 38 in some cases.

Figure 6:
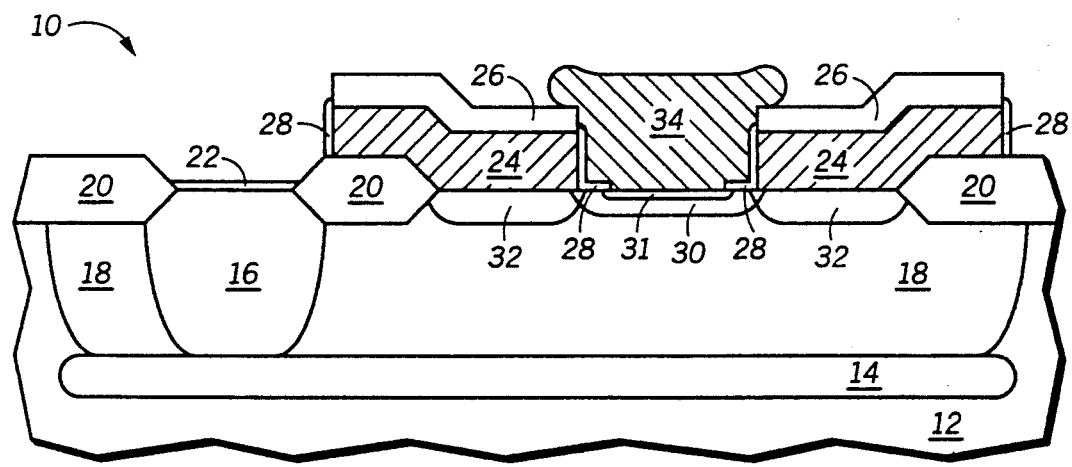

In FIG. 6, a conductive region 34, referred to also as a conductive contact region, is formed by epitaxial growth or selective processing. The spacers 38 are used as silicon growth seed regions. Spacers 38 are also referred to as growth source material or sidewall selective source material. In other words, the spacers 38, or a like sidewall formation, are a source of silicon for selective formation of the conductive region 34. In addition, an exposed surface of the collector well region 18 which lies between the spacers 38 is also an epitaxial seed layer or epitaxial source layer for formation of conductive region 34. The conductive region 34 may be selectively formed as any silicon based material such as polysilicon, single-crystalline silicon, germanium silicon, doped silicon, a silicide, or a combination of silicon-based materials in a preferred form. The conductive region 34 is either in-situ doped, ion implanted, or doped in a similar manner to a conductivity type which is the same as the collector well region 18 but opposite the conductivity type of the substrate 12.

A diffusion region, referred to as an emitter doped region 31, is formed by thermally driving dopant atoms out of the conductive region 34 into the doped base region 30. The emitter doped region 31 is of a conductivity type that is the same as the conductive region 34 and is self-aligned to the opening 36. Conductive region 34 forms an electrical contact to the emitter doped region 31. The conductive region 34 may also be referred to as a portion of an emitter electrode.

The conductive region 34 is laterally grown over a top portion of the dielectric layer 26 to form a self-aligned conductive contact pad. The conductive contact pad is used to more reliably form electrical contact between the emitter doped region 31 and an overlying conductive layer (not illustrated). Polysilicon is a preferred material for conductive region 34 because dopants diffuse in polysilicon at a rate that is faster than many other silicon-based conductive materials. In addition polysilicon has a lateral overgrowth to vertical growth rate ratio of 1:1 whereas single-crystalline silicon has a lateral to vertical growth rate ratio of 1:2. Therefore, a polysilicon epitaxial conductive region will have improved topography and have a potentially larger contact pad surface area to decrease electrical short circuits and/or misalignment problems.

One advantage of forming the transistor 10 as taught herein is due to the conductive spacers 38. The growth of conductive region 34 requires less time than selective growth from only the surface of doped base region 30 due to the presence of the spacers 38. Therefore, because epitaxial growth requires a high thermal temperature, a reduced growth time will result in less impurity diffusion and charge diffusion, shallower bipolar electrode junctions, and improved device performance. In other words, the thermal budget of the bipolar process taught above will be lessened, which is desirable, and more flexible.

It is important to note that diffusion regions for transistor electrodes may be formed in the substrate 12 prior to forming openings in overlying layers. Although the diffusion regions will not be self-aligned to the openings when using this method, this method is still used to some extent in the integrated circuit industry.

Figure 7:
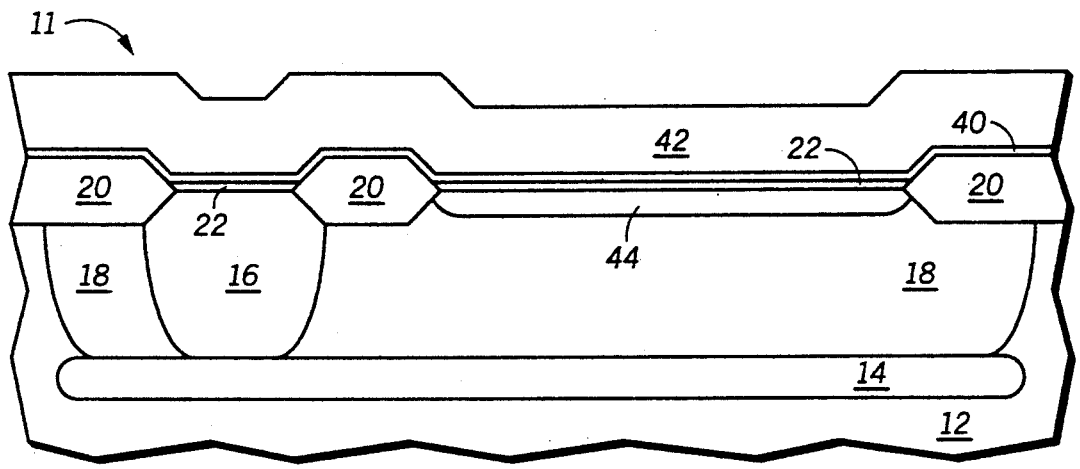
FIGS. 7-11 illustrate, in cross-sectional form, another method for forming a grown bipolar electrode contact in accordance with the present invention.

FIGS. 7-11 illustrate another method for forming an electrical contact to an electrode of a bipolar transistor 11. Elements of FIGS. 7-11 that are analogous to elements in FIGS. 1-6 are identically labeled. In FIG. 7, the substrate 12, the collector buried region 14, the deep collector region 16, the collector well region 18, and the dielectric layers 20 and 22 are formed or provided in a manner similar to that which is illustrated in FIG. 1.

In FIG. 7, a base diffusion region 44 is formed within the collector well region 18. The base diffusion region 44 has a conductivity type which is the same as the substrate 12. The base diffusion region 44 is either diffused or ion implanted before or after formation of the dielectric layer 22. Sacrificial oxides (not illustrated) or screen oxide layers (not illustrated) may also be used in a conventional manner to improve ion implantation processing. A dielectric layer 40 is formed overlying the dielectric layers 20 and 22. The dielectric layer 40 is preferably a nitride layer such as silicon nitride. The thickness of dielectric layer 40 is preferably less than 1000 Angstroms. A dielectric layer 42 is formed overlying the dielectric later 40. The dielectric layer 42 is preferably a TEOS-based oxide or a like dielectric layer.

Figure 8:
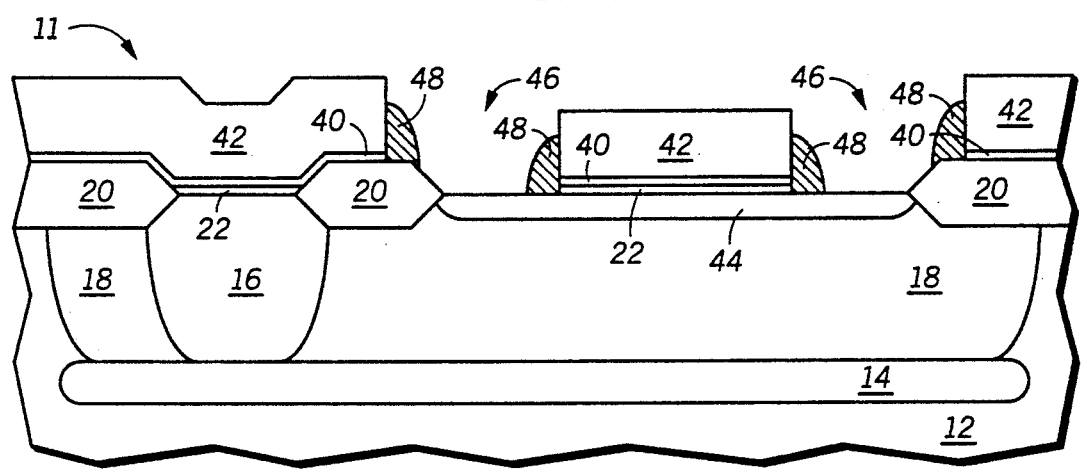

In FIG. 8, a plurality of openings 46 is formed through the dielectric layers 40 and 42. The plurality of openings 46 may be two physically separate openings or may form a single cylindrical-shaped opening. The cylindrical-shaped opening would surround the portion of the dielectric layer 42 which overlies the collector well region 18. The plurality of openings 46 is formed by silicon and/or TEOS etching. Silicon nitride and/or TEOS etching is accomplished via $CHF_3$ or $CF_4$ combined with $O_2$ or $CO_2$ in a plasma environment or $C_2F_6$ plasma environments. In addition, silicon nitride may be wet etched in a solution of phosphoric acid $((C_2H_5O)_2POOH)$ or may be etched via methanol-based $(CH_3OH)$ chemistry. Oxide may be wet etched in an HF solution or buffered HF which is HF mixed with ammonia hydroxide. The etching of dielectric layer 42 is performed selectively to dielectric layer 40, and dielectric layer 40 is etched selective to dielectric layer 20 and base diffusion region 44.

In FIG. 8, conductive sidewall spacers 48 are formed adjacent sidewalls of the openings 46 as illustrated. An RIE over-etch step may be optionally used to vertically recess the spacers 48 down the sidewalls of the dielectric layer 42 as illustrated in FIG. 8. In a preferred form, spacers 48 are formed of polysilicon or a like silicon-based material.

Figure 9:
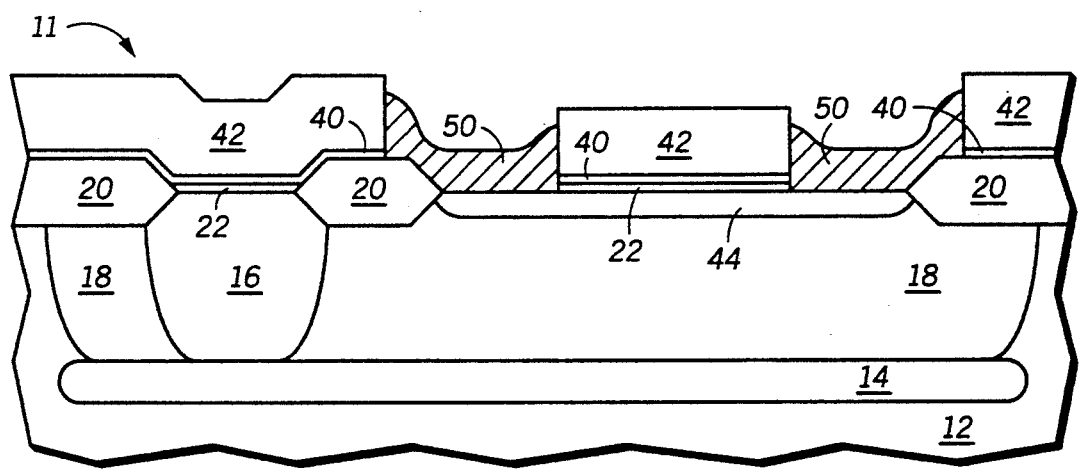

In FIG. 9, an epitaxial growth step is used to form a conductive region 50. Conductive region 50 is epitaxially or selectively seeded from the spacers 48 and in most cases is also epitaxially seeded from exposed portions of base diffusion region 44. The vertical recession of the spacers reduces or prevents lateral overgrowth of conductive region 50 over top surfaces of dielectric layer 42. In this embodiment, the lateral overgrowth of the conductive region 50 is undesirable. The conductive region 50 makes electrical contact to the base diffusion region 44 and therefore makes electrical contact to a base electrode of transistor 11. Conductive region 50 may be in-situ doped, ion implanted, or doped in any manner with dopant atoms. The dopant atoms have a conductivity type which is the same as the conductivity type of the substrate 12.

Figure 10:
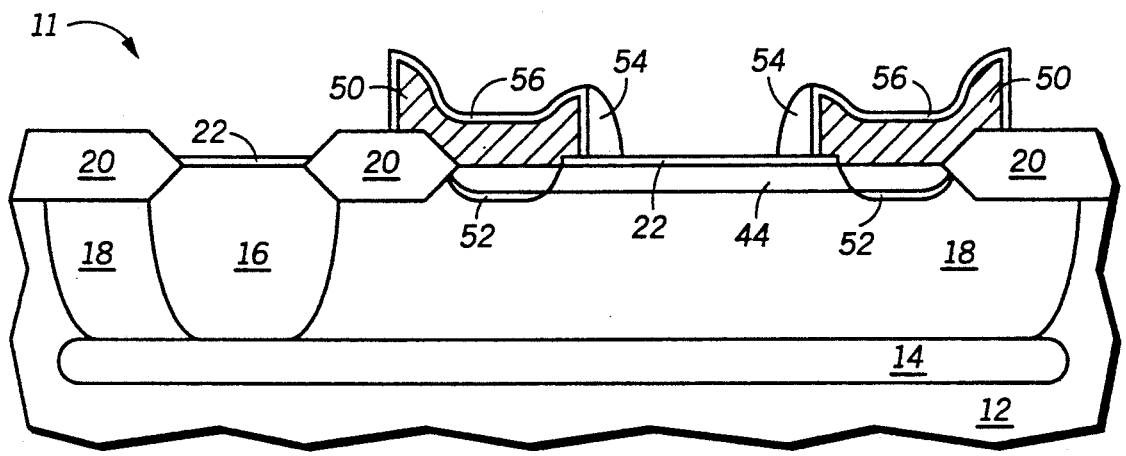

In FIG. 10, the dielectric layers 40 and 42 are completely removed and a dielectric layer 56 is formed to insulate the conductive region 50. Preferably, the dielectric layer 56 is grown from conductive region 50 thereby forming a silicon-based oxide layer (i.e. silicon dioxide).

In FIG. 10, a conductive layer (not illustrated) is deposited over the surfaces of dielectric layers 20, 22, and 56. The conductive layer (not illustrated), which is preferably polysilicon or a silicon-based material, is etched to form a spacer 54. It should be apparent that the spacer 54 will form along other sidewalls illustrated in FIG. 10. The spacers formed adjacent other sidewalls are removed by conventional masking and etching procedures which were also illustrated and taught in reference to FIGS. 4-5.

In addition, dopant atoms from the conductive region 50 are thermally driven from the conductive region 50 into the substrate 12 and/or base diffusion region 44 via a heat cycle to form a base diffusion region 52. Typical dopant atoms are boron for a P type dopant and arsenic or phosphorus for an N type dopant.

Figure 11:
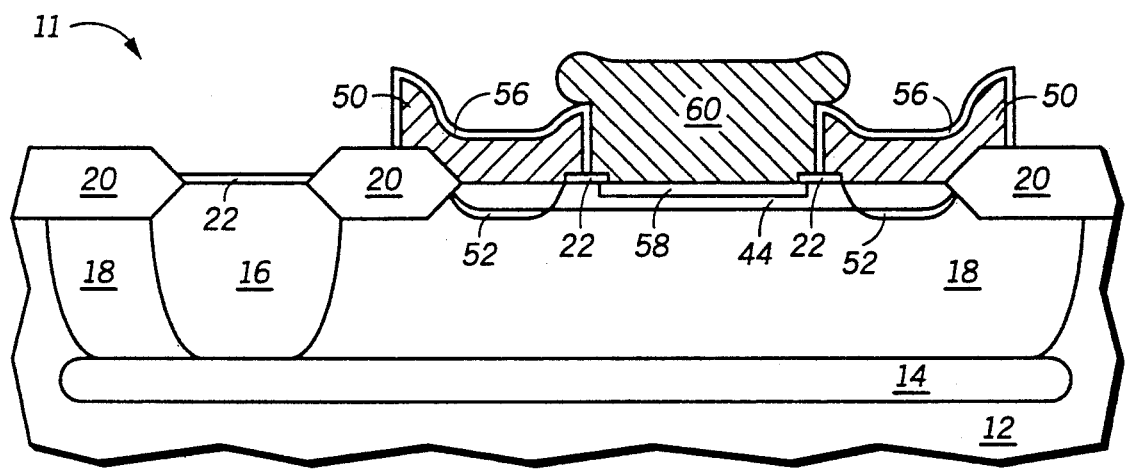

In FIG. 11, a portion of the dielectric layer 22 which is exposed within an inner perimeter of the spacer 54, is removed. A self-aligned emitter contact, referred to as a conductive region 60, is formed via a process similar to the process taught for conductive region 34 of FIG. 6. Furthermore, dopant atoms are placed within conductive region 60 as described herein. A heat cycle is used to thermally drive dopant atoms from the conductive region 60 to form an emitter doped region 58. The conductive region 60 has all of the advantages of conductive region 34, such as the formation of an improved self-aligned contact pad, improved overgrowth capability, and a reduced thermal budget. A collector contact to deep collector region 16 is formed in one of several conventional manners (not illustrated in FIG. 11).

Figure 12:
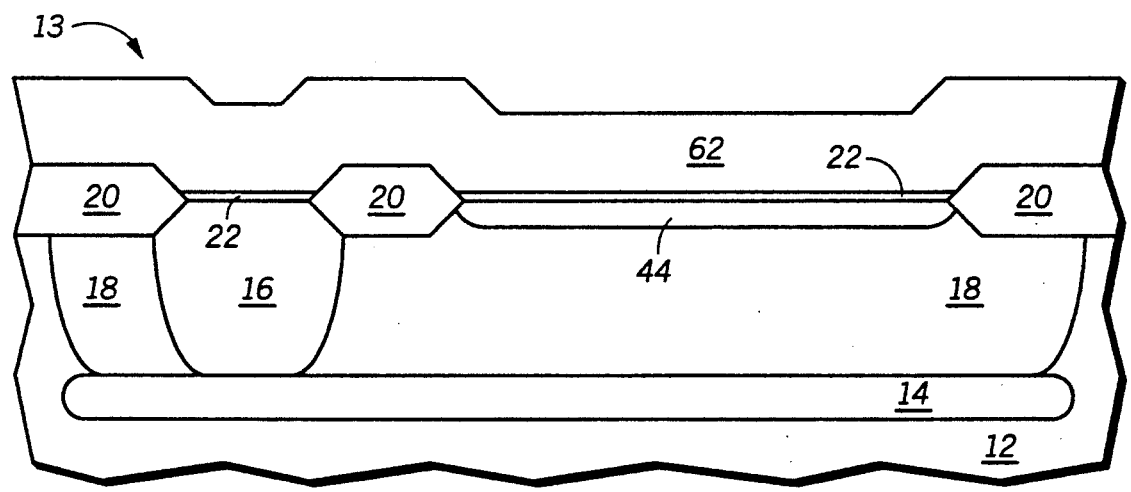
FIGS. 12-14 illustrate, in cross-sectional form, yet another method for forming a grown bipolar electrode contact in accordance with the present invention.
Figure 13:
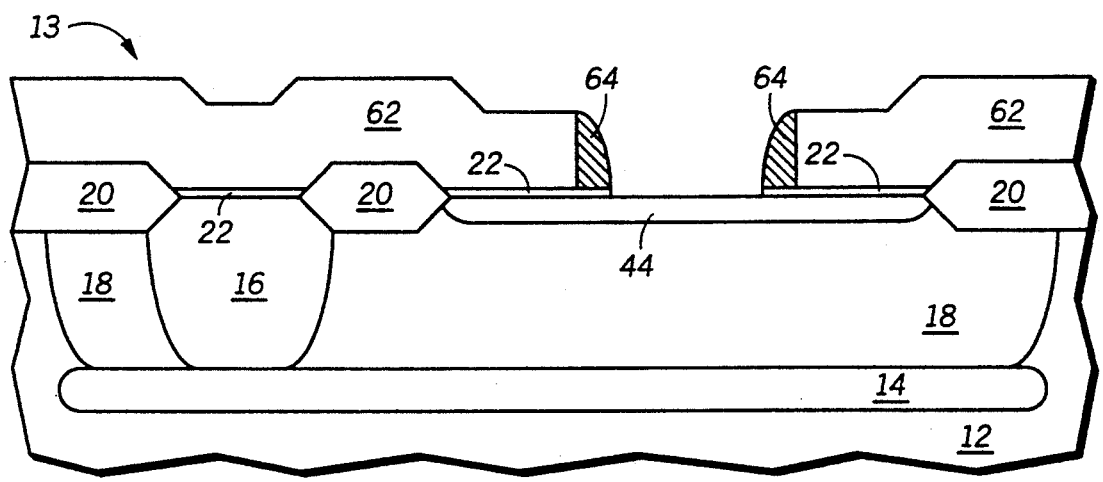
Figure 14:
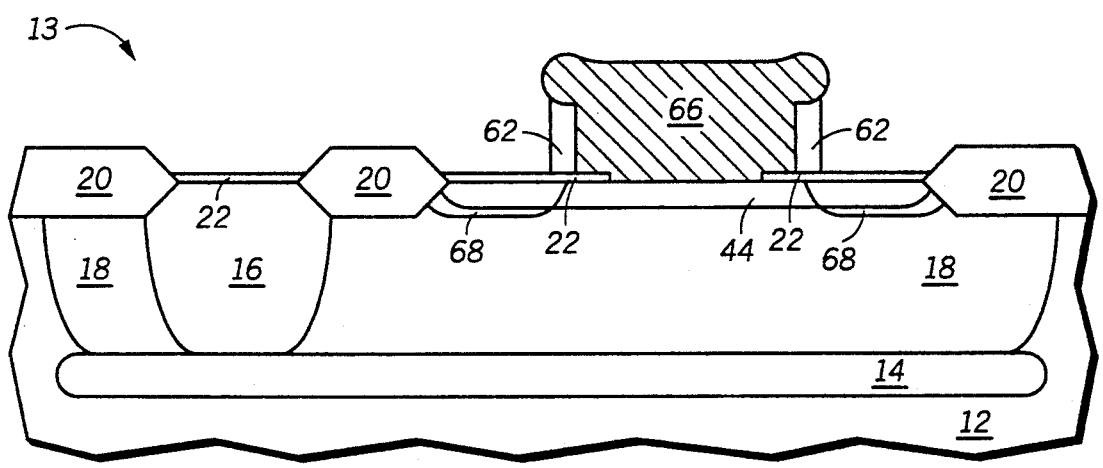

FIGS. 12-14 illustrate yet another method for forming a self-aligned contact to an emitter electrode of a bipolar transistor 13. Element in FIGS. 12-14 which are analogous to elements FIGS. 7-11 are identically labeled. In FIG. 12, the substrate 12, the collector buried region 14, the deep collector region 16, the collector well region 18, the dielectric layers 20 and 22, and the base diffusion region 44 are formed or provided in a manner similar to the process discussed above in reference to FIG. 7. A dielectric layer 62 is formed overlying the dielectric layers 20 and 22. Preferably, dielectric layer 62 is a TEOS-based dielectric layer which has a thickness ranging from roughly 2,000 Angstroms to 10,000 Angstroms.

In FIG. 13, an opening is formed in the dielectric layer 62 as illustrated. The opening exposes a portion the base diffusion region 44. A thin dielectric layer (not illustrated) is grown over the exposed portion of the base diffusion region 44 to replace the removed dielectric layer 22. A spacer 64 is formed from a silicon-based material as described herein. The thin dielectric layer (not illustrated) which overlies the base diffusion region and lies within an inner perimeter of the spacer 64 is selectively removed. A portion of dielectric layer 22 remains underlying the spacer 64 as illustrated.

In FIG. 14, the spacer 64 and an exposed portion of the base diffusion region 44 are used to epitaxially seed the conductive region 66 as described herein. The dielectric layer 62 is removed to expose portions of the base diffusion region 44. The exposed portions of the base diffusion region 44 are implanted or doped to form base regions 68 which are self-aligned via conductive region 66. The doping or implanting of base regions 68 may optionally be performed through a dielectric screen layer (illustrated as a portion of dielectric layer 22). Contact to the base regions 68 and the deep collector region 16 are accomplished in a conventional manner.

Figure 15:
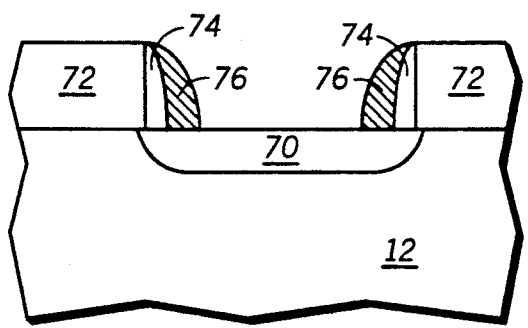
FIG. 15 illustrates, in cross-sectional form, a spacer formation that is used as a source material for formation of a grown bipolar electrode contact in accordance with the present invention.

FIG. 15 illustrates an alternative spacer formation that is used to provide an epitaxial growth source region to form a grown bipolar electrode contact. In FIG. 15, the substrate 12 is as described herein. A diffusion 70 may be one of either a collector, an emitter, or a base electrode formation or only a portion of one of these electrodes. A material 72, which in most cases is a dielectric material, is formed overlying the substrate 12 and has an opening. A dielectric spacer 74 is formed adjacent a sidewall of the opening. Spacer 74 is preferably made of an oxide or nitride material. A conductive spacer 76 is formed adjacent the dielectric spacer 74. The conductive spacer 76 is used to seed a conductive electrical contact (not illustrated in FIG. 15) to the diffusion 70 in an epitaxial or selective manner. This method may be used in any of the embodiments illustrated herein, in any bipolar transistor structure, or in any structures requiring electrical contact or connection. One advantage is that smaller contacts or smaller bipolar electrodes are desired for some applications. Smaller contacts and/or smaller bipolar electrodes will result when using the structure illustrated in FIG. 15.

Figure 16:
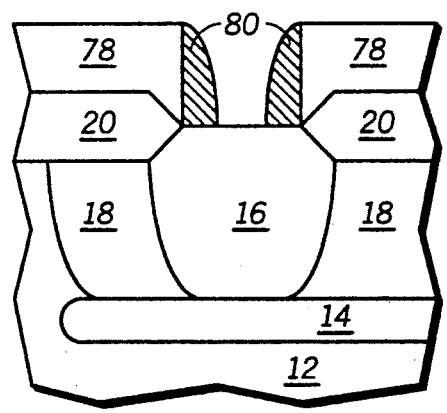
FIG. 16 illustrates, in cross-sectional form, yet another method for forming a grown bipolar electrode contact in accordance with the present invention.

In FIG. 16, a method for forming selective or epitaxial electrical contact to a collector electrode is illustrated. The contact may be formed simultaneously with the formation of either a base contact or an emitter contact or may be formed sequentially along with the formation of other contacts. In FIG. 16, the substrate 12, the collector buried region 14, the deep collector region 16, the collector well region 18, and the dielectric layers 20 and 22 are formed or provided in a manner similar to that which is illustrated in FIG. 1.

In FIG. 16, a dielectric layer 78 is formed wherein dielectric layer 78 has an opening. A conductive spacer 80 is formed as described herein. The conductive spacer 80 is used to seed or source a selective or epitaxial contact to the deep collector region 16 as described herein. Therefore, a collector region contact may have all of the advantages discussed herein in reference to FIGS. 6, 11, and 14.

Figure 17:
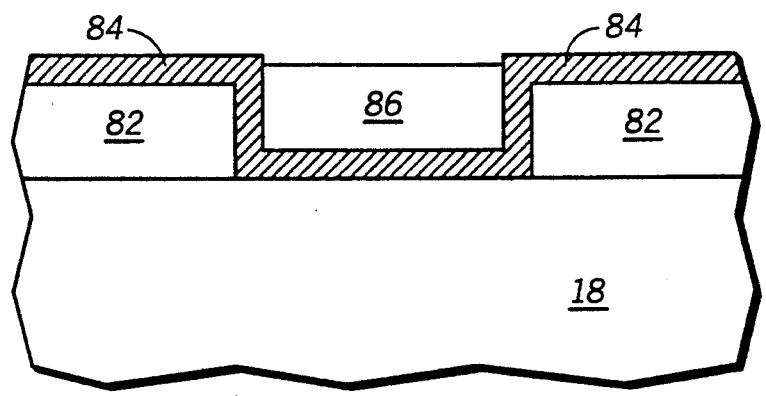
FIGS. 17 and 18 illustrate, in cross-sectional form, yet another method for forming a grown bipolar electrode contact in accordance with the present invention.
Figure 18:
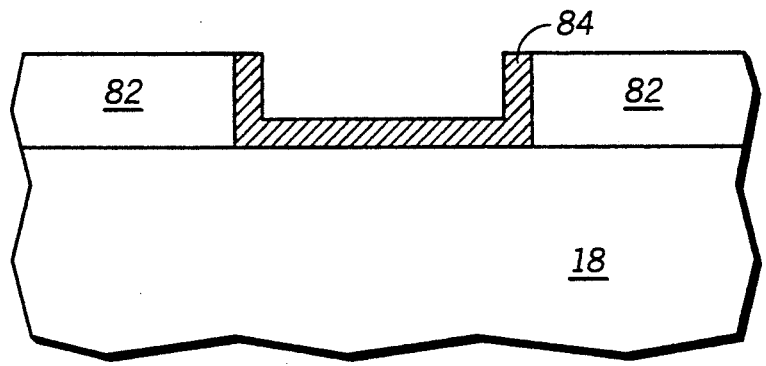

In FIGS. 17-18, another method for forming a self-aligned grown bipolar electrode contact is illustrated. FIG. 17 illustrates the doped collector well region 18 which is identically labeled to FIG. 1. A dielectric layer 82 is formed in FIG. 17. The dielectric layer 82 has an opening. A seed layer of material is deposited to form a layer 84. Preferably layer 84 is polysilicon or a similar seed layer. A dielectric layer 86 is formed overlying layer 84 via spin-on techniques, planarization etch-back, chemical mechanical polishing (CMP), or the like as illustrated in FIG. 17. It should be mentioned that in FIGS. 17-18 all regions within collector well region 18 and many other structural regions are not specifically illustrated. FIGS. 17-18 are intended to focus on the contact formation and focus less on the other structural details which have already been taught herein.

In FIG. 18, portions of the layer 84 which overlie the dielectric layer 82 are removed leaving a "U" shaped region of layer 84 in the opening of dielectric layer 82 due to dielectric layer 86. Dielectric layer 86 is then removed selective to layer 84. Layer 84 is then used as a source for selective growth. It is important to note that the method illustrated in FIGS. 17-18 may be used to minimize trenching of various substrate regions.

Figure 19:
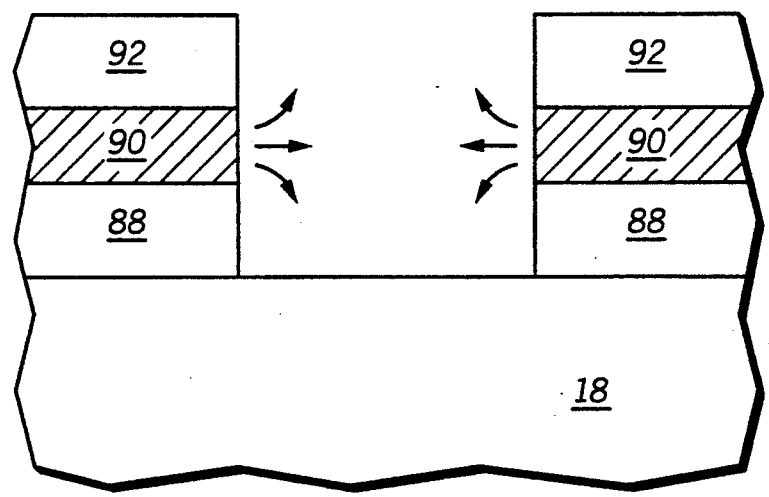
FIG. 19 illustrates, in cross-sectional form, yet another method for forming a grown bipolar electrode contact in accordance with the present invention.

FIG. 19 illustrates yet another method which may be used to form a grown bipolar electrode contact. The collector well region 18 is illustrated in FIG. 19. As in FIGS. 17-18, all regions within collector well region 18 and many other structural regions are not specifically illustrated for simplicity. A dielectric layer 88 is formed, a conductive seed layer 90 is formed overlying the dielectric layer 88, and a dielectric layer 92 is formed overlying the conductive seed layer 90. An opening is formed through the layers 88, 90, and 92 as illustrated in FIG. 19. A sidewall of conductive seed layer 90 is used to grow a portion of the selective grown bipolar electrode contact. Growth occurs in the directions of the arrows which are illustrated in FIG. 19.

Figure 20:
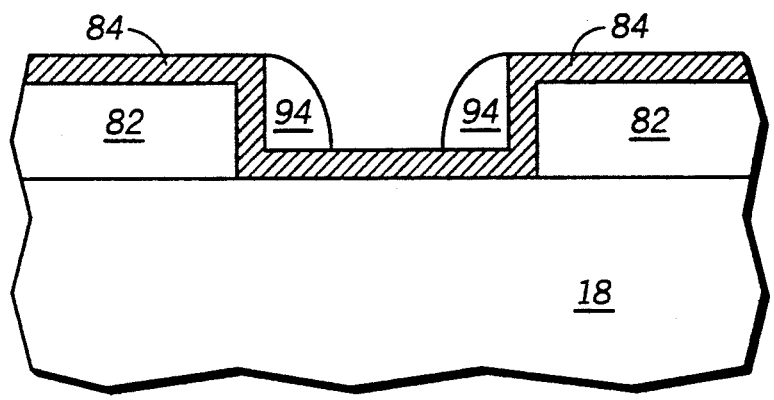
FIGS. 20 and 21 illustrate, in cross-sectional form, yet another method for forming a grown bipolar electrode contact in accordance with the present invention.
Figure 21:
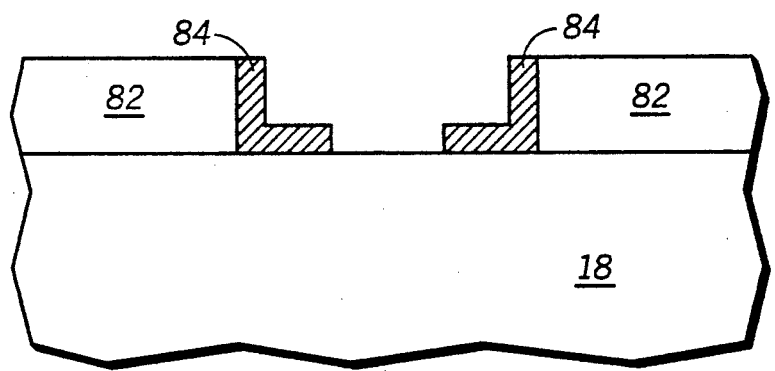

FIGS. 20-21 illustrate yet another method for forming a grown bipolar electrode contact. The collector well region 18, the dielectric layer 82 with the opening, and the layer 84 are illustrated as in FIGS. 17-18. As in FIGS. 17-18, all regions within collector well region 18 and many other structural regions are not specifically illustrated for simplicity. In FIG. 20, a dielectric spacer 94 is formed overlying the layer 84 and adjacent a sidewall of the opening in dielectric layer 82. An etch step is performed to form an "L" shaped region of seed material from layer 84 using the dielectric spacer 94 as a hard mask. Region 84 is used as a source material for contact growth.

While the present invention has been illustrated and described with reference to specific embodiments, further modifications and improvements will occur to those skilled in the art. For example, electrical contacts may be made to other devices using the inventive methods discussed herein. In addition, the method discussed herein may be able to form electrical contacts for any lateral or vertical bipolar device. The methods of growing electrical contacts, as taught herein, may be used to connect two substrate-overlying conductive layers together. In other words, the contact methods taught herein are not limited to substrate contacts. For example, the substrate 12 of FIG. 15 could instead be a dielectric layer, and the diffusion 70 of FIG. 15 could instead be a conductive region overlying an underlying substrate. Epitaxial growth, as discussed in the above embodiments is intended to cover any selective method of formation which is seeded from spacers or sidewall formations. There are sidewall formations, other than spacers, that are functionally equivalent to spacers which are formed by other methods, such as selective deposition used in conjunction with etch-back or planarization techniques. The spacers described herein may also be formed as silicided or salicided material or other known conductive seed materials such as TiN. Overgrowth of the epitaxial electrical connection taught herein is optional. Growth, as lithographic dimensions are reduced or if underlying layers do not provide for growth, may be initiated only off of the spacers. The growth from spacers which is taught herein may result in electrode contact regions which have non-planar top surfaces. Known chemical and/or mechanical polishing steps or like planarization steps may be used to planarize the top surface of the electrode contact regions taught herein. It is to be understood, therefore, that this invention is not limited to the particular forms illustrated and that it is intended in the appended claims to cover all modifications that do not depart from the spirit and scope of this invention.

We claim:

1. A method for forming an electrical contact to a bipolar transistor electrode comprising the steps of:
   providing a substrate;
   forming a layer of material having a top surface and overlying the substrate;
   forming a contact opening in the layer of material wherein the contact opening exposes a portion of the substrate and has a sidewall, said contact opening having a first radius;
   forming a conductive region within the substrate, the conductive region functioning as a portion of said bipolar transistor electrode;
   forming a sidewall selective source material adjacent the sidewall of the contact opening, the sidewall selective source material reducing the contact opening from the first radius to a second radius wherein the second radius is smaller than the first radius; and
   forming a conductive contact region within the contact opening by growing the conductive contact region using the sidewall selective source material as a growth source, the conductive contact region forming said electrical contact to the bipolar transistor electrode in a reduced growth time due to reduction in radius of the contact opening.

2. The method of claim 1 wherein the step of forming the conductive contact region comprises:
   laterally overgrowing the conductive contact region over a portion of the top surface of the layer of material to form a self-aligned contact region for the bipolar transistor electrode.

3. The method of claim 1 wherein the step of forming the conductive region within the substrate comprises:
   forming the conductive region as a portion of the bipolar transistor electrode wherein the bipolar transistor electrode is an electrode selected from a group consisting of: an emitter electrode, a collector electrode, and a base electrode.

4. The method of claim 1 wherein the step of forming the conductive region within the substrate comprises:
   forming the conductive region self-aligned to the contact opening by doping a portion of the substrate which is exposed by the contact opening.

5. The method of claim 1 wherein the step of forming the conductive contact region comprises:
   forming the conductive contact region by using both the sidewall selective source material and an exposed portion of the substrate which is exposed by said contact opening as growth sources.

6. The method of claim 1 wherein the step of forming the sidewall selective source material comprises:
   forming the sidewall selective source material from a material which comprises silicon.

7. The method of claim 1 further comprising a step of:
   forming a dielectric region between said sidewall selective source material and said sidewall of the contact opening.

8. The method of claim 1 wherein the step of forming the sidewall selective source material comprises:
   forming the sidewall selective source material as a sidewall spacer.

9. A method for forming an electrical contact to a bipolar transistor electrode comprising the steps of:
   providing a silicon substrate;
   forming a layer of material having a top surface and overlying the silicon substrate;
   etching an opening in the layer of material wherein the opening has a volume, exposes a portion of the silicon substrate to form an exposed silicon substrate portion, defines placement of the electrical contact, and has a sidewall;
   forming a conductive region within the exposed silicon substrate portion, the conductive region functioning as said bipolar transistor electrode;
   forming an etch stop layer within the opening;
   depositing a layer of conductive material which comprises silicon;
   etching the layer of conductive material selective to the etch stop layer to form a conductive sidewall spacer which is adjacent the sidewall of the opening and which reduces said volume of the opening, the conductive sidewall spacer comprising silicon; and growing a conductive contact region, which comprises
silicon, within the opening by using the conductive sidewall spacer as a source for growth, the conductive contact region forming said electrical contact to the bipolar transistor electrode.

10. The method of claim 9 wherein the step of growing the conductive contact region comprises:
laterally overgrowing the conductive contact region over a portion of the top surface of the layer of material to form a self-aligned contact region for the bipolar transistor electrode.

11. The method of claim 9 wherein the step of forming a conductive region within the silicon substrate comprises:
forming the conductive region as a portion of the bipolar transistor electrode wherein the bipolar transistor electrode is an electrode selected from a group consisting of: an emitter electrode, a collector electrode, and a base electrode.

12. The method of claim 9 wherein the step of forming the conductive region within the silicon substrate comprises:
forming the conductive region self-aligned to the opening by doping a portion of the exposed silicon substrate portion to form a diffusion region.

13. The method of claim 9 further comprising a step of: forming said etch stop layer as a dielectric region between said conductive sidewall spacer and said sidewall of the opening.

14. A method for forming a self-aligned electrical contact region to a bipolar transistor electrode comprising the steps of:
providing a silicon substrate;
forming a dielectric layer of material overlying the silicon substrate, the dielectric layer of material having a top surface;
forming a contact opening in the dielectric layer of material wherein the contact opening exposes a portion of the silicon substrate to form an exposed portion of the silicon substrate and has a sidewall;
forming a conductive doped region within the silicon substrate, the conductive doped region functioning as at least a portion of said bipolar transistor electrode;

forming a sidewall spacer adjacent the sidewall of the contact opening, for the purpose of reducing the contact opening from a first radius to a smaller second radius to reduce contact opening volume;
growing a conductive epitaxial region to fill a portion of the contact opening by using the sidewall spacer and a portion of the exposed portion of the silicon substrate as a source for growth, the conductive epitaxial region forming said electrical contact to at least a portion of said bipolar transistor electrode; and
overgrowing the conductive epitaxial region laterally over the top surface of the dielectric layer of material to form said self-aligned electrical contact region for the bipolar transistor electrode, the self-aligned electrical contact region at least partially overlying the conductive doped region.

15. The method of claim 14 wherein the step of forming the conductive doped region within the silicon substrate comprises:
forming the conductive doped region as a portion of the bipolar transistor electrode wherein the bipolar transistor electrode is an electrode selected from a group consisting of: an emitter electrode, a collector electrode, and a base electrode.

16. The method of claim 14 wherein the step of forming the conductive doped region within the silicon substrate comprises:
forming the conductive doped region self-aligned to the contact opening by doping a portion of the silicon substrate which is exposed by the contact opening.

17. The method of claim 14 wherein the step of forming the conductive epitaxial region comprises:
doping the conductive epitaxial region by using one of either in-situ doping or ion implantation.

18. The method of claim 14 wherein the step of forming the sidewall spacer comprises:
forming the sidewall spacer from a material that comprises silicon.

19. The method of claim 14 further comprising a step of:
forming a dielectric region between said sidewall spacer and said sidewall of the contact opening.

20. The method of claim 14 further comprising a step of:
forming a portion of the bipolar transistor electrode by thermally driving dopant atoms from the conductive epitaxial region into the silicon substrate.

* * * * *